United States Patent [19]
Sakuragi

[11] Patent Number: 5,880,639
[45] Date of Patent: Mar. 9, 1999

[54] AMPLIFICATION CIRCUIT

[75] Inventor: Takamasa Sakuragi, Hiratsuka, Japan

[73] Assignee: Canon Kabushiki Kaisha, Tokyo, Japan

[21] Appl. No.: 907,049

[22] Filed: Aug. 6, 1997

[30] Foreign Application Priority Data

Aug. 27, 1996 [JP] Japan ................................. 8-224816

[51] Int. Cl.⁶ ................................................. H03F 3/45
[52] U.S. Cl. .......................................... 330/255; 330/252
[58] Field of Search ................................ 330/253, 252, 330/255, 295, 311, 292

[56] References Cited

U.S. PATENT DOCUMENTS 4,766,394  8/1988  Yukawa ................................... 330/253

*Primary Examiner*—Robert Pascal
*Assistant Examiner*—Patricia Nguyen
*Attorney, Agent, or Firm*—Fitzpatrick Cella Harper & Scinto

[57] ABSTRACT

In order to satisfy both signal stability and high-speed operation of an amplification circuit, the amplification circuit includes first and second differential means, a first driving means for driving to flow a current from an output terminal to a low potential power supply at a low impedance on the basis of an output from the first differential means, a first constant current means connected in parallel with the first driving means to flow a current from the output terminal to the low potential power supply at a high impedance, a second driving means for driving to flow a current from a high potential power supply to the output terminal at a low impedance on the basis of an output from the second differential means, and a second constant current means connected in parallel with the second driving means to flow a current from the high potential power supply to the output terminal at a high impedance, wherein the noninverting input terminal of the first differential means has a lower offset voltage than that of the inverting input terminal thereof, and the noninverting input terminal of the second differential means has a higher offset voltage than that of the inverting input terminal thereof.

10 Claims, 6 Drawing Sheets

AMPLIFICATION CIRCUIT

BACKGROUND OF THE INVENTION

1. Field of the Invention

The present invention relates to an amplification circuit and, more particularly, to an amplification circuit using negative feedback.

2. Related Background Art

As shown in FIG. 1, an amplification circuit using negative feedback comprises a differential amplification circuit 101 as the initial stage driven by a constant current source to stabilize a bias, a transimpedance circuit 102 for receiving an output current from the differential amplification circuit 101 as the initial stage and performing current-to-voltage conversion using a current mirror circuit, and an output buffer circuit 103 for receiving the output from the transimpedance circuit 102 and performing impedance conversion to obtain a low impedance output. This amplification circuit includes transistors Q1 to Q4 and Q11 to Q14, resistors R1, R2, and R5 to R8, a capacitor C1, and a current source I1. The circuit also includes a power supply terminal 1, a reference potential such as the GND (ground) potential 2, a buffer amplifier 3, an output terminal 4, a noninverting input terminal 5, and an inverting input terminal 6.

In the above circuit example, to perform a stable operation without any oscillation while certain negative feedback is performed from the output to the input, the frequency characteristics of the magnitude and phase of an amplifier gain in the absence of negative feedback (this gain is called an open loop gain hereinafter) must have a phase rotation amount of 180° or less for the gain in the negative feedback state (0 db in FIGS. 2A and 2B), as shown in FIGS. 2A and 2B. To obtain higher stability, the phase rotation amount is preferably 120° or less. For this purpose, the frequency (to be referred to as a first pole hereinafter) lower than the low-frequency gain of the open loop gain by −3 db must be lowered using the phase compensation capacitor C1. For this reason, the value of the phase compensation capacitor C1 increases. The current of the transimpedance circuit 102 for driving the phase compensation capacitor C1 is determined by the bias current value of the differential amplification circuit 101 as the initial stage. The charge/discharge rate of the phase compensation capacitor C1 lowers. In the amplification circuit using the negative feedback, stability trades off for high speed. Basically, when the stability is determined, the speed is determined accordingly. A problem may be posed depending on a circuit application condition in terms of the operation speed.

SUMMARY OF THE INVENTION

The present invention has been made in consideration of the above problem, and has as its object to provide an amplification circuit capable of outputting a waveform at a high speed until a given voltage before an output voltage from an amplifier reaches an input voltage and a stable waveform at a low speed without ringing until the output voltage reaches the input voltage, and capable of obtaining a high-speed, high-accuracy, low-noise output waveform.

It is another object of the present invention to provide an amplification circuit excellent in response and transient characteristics almost free from overshooting and undershooting without requiring complicated, advanced circuit design.

It is still another object of the present invention to provide an amplification circuit having a noninverting input terminal, an inverting input terminal, and an output terminal, comprising a first differential stage having noninverting and inverting input terminals respectively connected to the noninverting and inverting input terminals of the amplification circuit, a first driving stage for driving to flow a current from the output terminal to a low potential power supply at a low impedance on the basis of an output from the first differential stage, a first constant current stage connected in parallel with the first driving stage to flow a current from the output terminal to the low potential power supply at a high impedance, a second differential stage having noninverting and inverting input terminals respectively connected to the noninverting and inverting input terminals of the amplification circuit, a second driving stage for driving to flow a current from a high potential power supply to the output terminal at a low impedance on the basis of an output from the second differential stage, and a second constant current stage connected in parallel with the second driving stage to flow a current from the high potential power supply to the output terminal at a high impedance, wherein the noninverting input terminal of the first differential stage has a lower offset voltage than that of the inverting input terminal thereof, and the noninverting input terminal of the second differential stage has a higher offset voltage than that of the inverting input terminal thereof.

It is still another object of the present invention to provide an amplification circuit comprising at least two differential stages as initial stages having different offsets, driving stages connected to the outputs of the differential stages, and a phase compensation capacitor, wherein the driving stage connected to one of the differential stages comprises a circuit for driving to charge the phase compensation capacitor at a low impedance, and a circuit for discharging the phase compensation capacitor at a high impedance, the driving stage connected to the other of the differential stages comprises a circuit for driving to charge the phase compensation capacitor at a high impedance and a circuit for discharging the phase compensation capacitor at a low impedance, and output sections of the driving stages are commonly connected to the phase compensation capacitor.

DESCRIPTION OF THE PREFERRED EMBODIMENTS

The basic concept of a circuit according to the present invention lies in the following two points. First, a low impedance element is used to charge a phase compensation capacitor, while a high impedance element such as a current source is used to discharge the phase compensation capacitor. Second, a high impedance element is used to charge the phase compensation capacitor, while a low impedance element is used to discharge the phase compensation capacitor. The outputs of the next stages are commonly connected, and the phase compensation capacitor is commonly used.

The preferred embodiments of the present invention will be described in detail with reference to the accompanying drawings.

Figure 1:
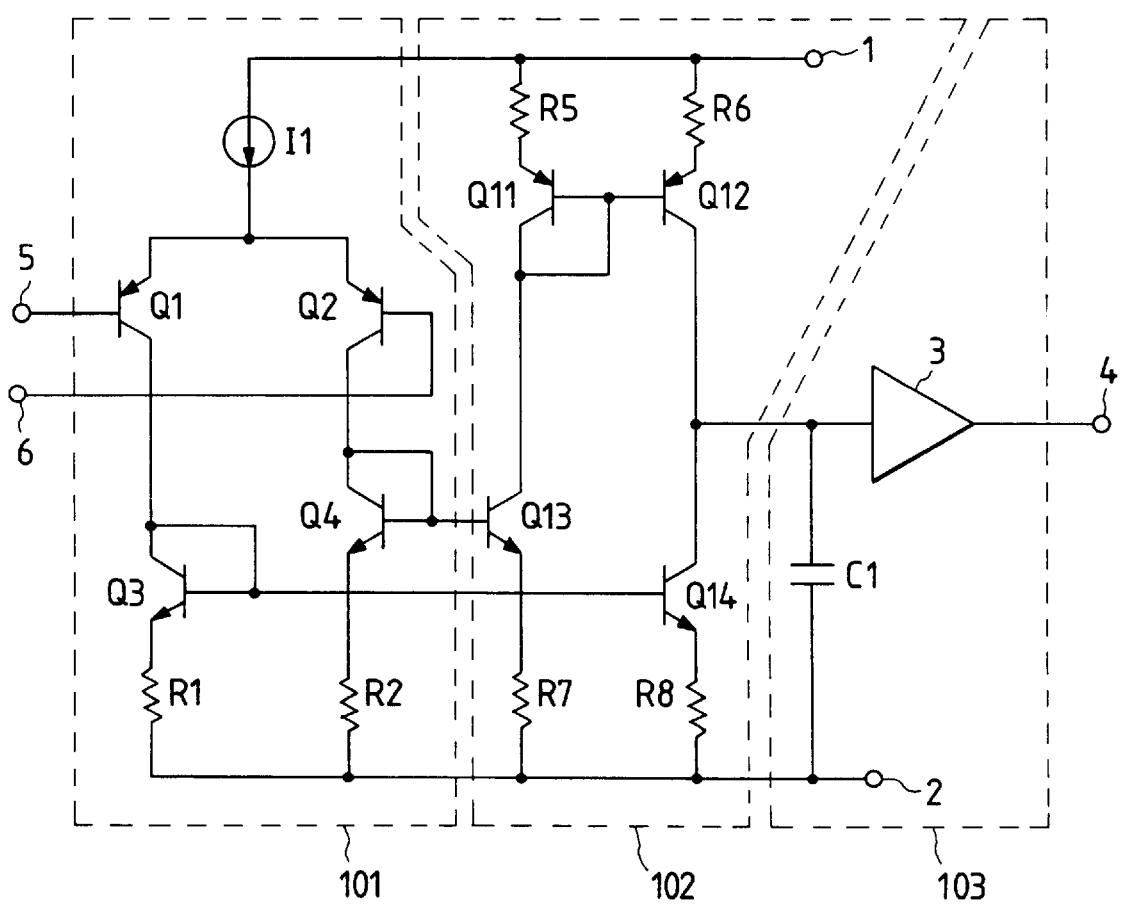
FIG. 1 is a schematic circuit diagram showing an example of an amplification circuit.
Figure 2A:
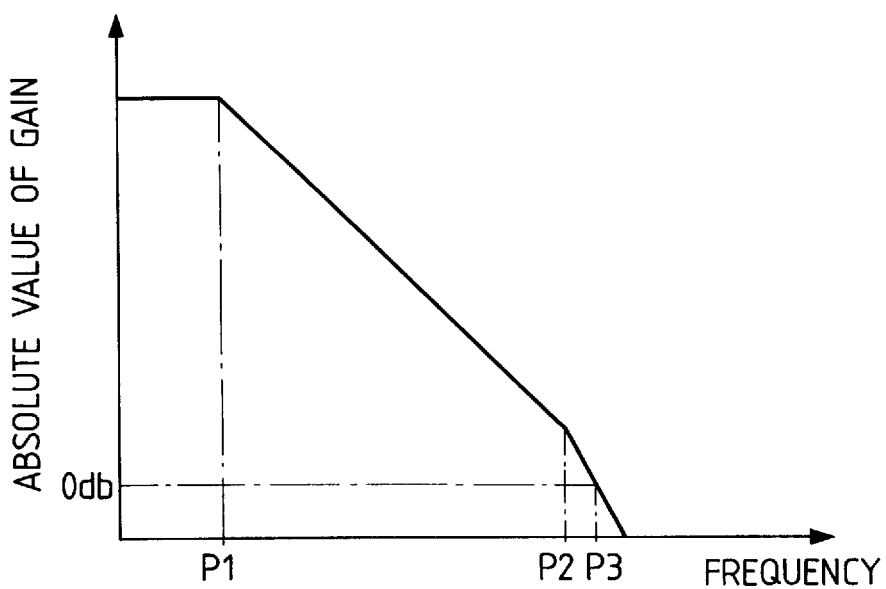
FIGS. 2A and 2B are graphs for explaining a problem in the amplification circuit represented in FIG. 1.
Figure 2B:
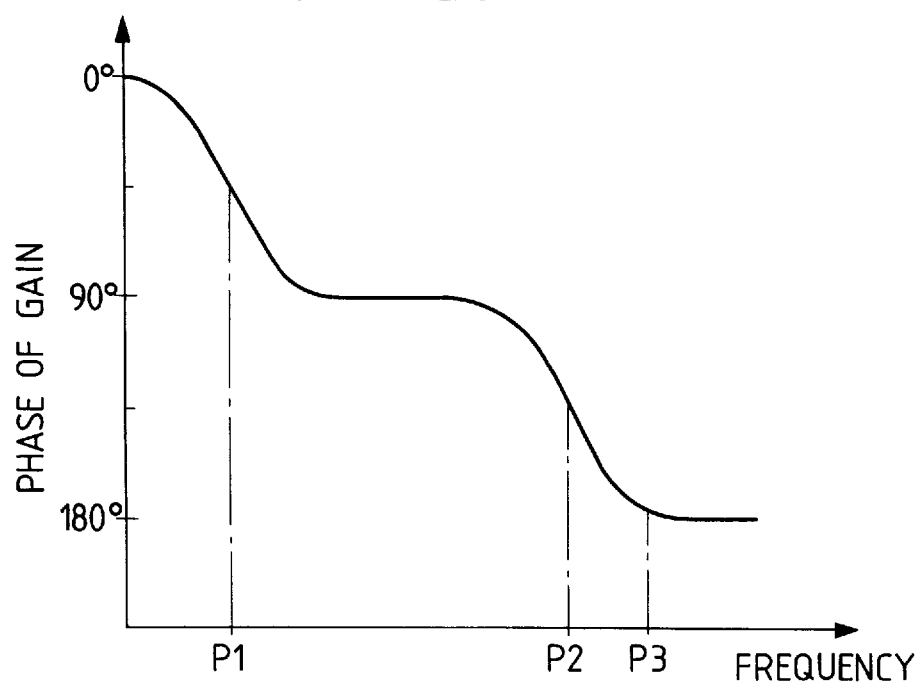
Figure 3:
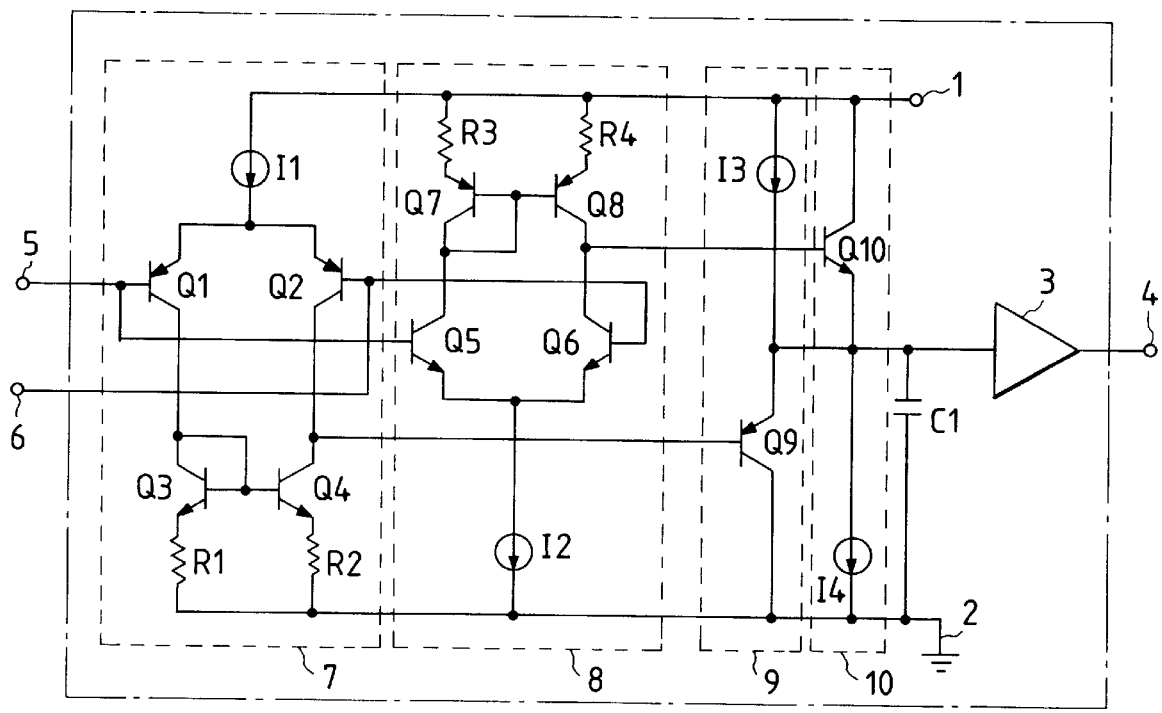
FIG. 3 is a schematic circuit diagram of an amplification circuit according to an embodiment of the present invention.

FIG. 3 is a circuit diagram of an amplification circuit according to an embodiment of the present invention. This circuit has noninverting and inverting input terminals 5 and 6, and an output terminal 4. The circuit is constituted by a first differential stage 7, a second differential stage 8, a first emitter follower stage 9 having an emitter follower arrangement with a constant current load, a second emitter follower stage 10 having the same emitter follower arrangement as the first emitter follower stage 9, a phase compensation capacitor C1, and a buffer amplifier 3 for performing impedance conversion. The amplification circuit further has a power supply terminal 1 for applying a power supply voltage to the respective stages, and a GND terminal (ground terminal) 2 having a reference potential connected to the respective stages.

The first differential stage 7 has a current source I1 electrically connected to the power supply terminal 1, pnp transistors Q1 and Q2 whose emitters are connected to the current source I1, npn transistors Q3 and Q4 whose collectors are respectively connected to the collectors of the pnp transistors Q1 and Q2, and resistors R1 and R2 respectively connected to the emitters of the npn transistors Q3 and Q4. The terminals of the resistors R1 and R2 which are not connected to the transistors Q3 and Q4 are connected to the GND terminal 2. The noninverting and inverting input terminals 5 and 6 of the amplification circuit are respectively connected to the bases of the pnp transistors Q1 and Q2 which serve as the noninverting and inverting input terminals of the first differential stage 7.

The second differential stage 8 has resistors R3 and R4, pnp transistors Q7 and Q8 whose emitters are respectively connected to the resistors R3 and R4, npn transistors Q5 and Q6 whose collectors are respectively connected to the collectors of the pnp transistors Q7 and Q8, and a current source I2 electrically connected to the GND terminal 2 to which the emitters of the npn transistors Q5 and Q6 are commonly connected. The noninverting and inverting input terminals 5 and 6 of the amplification circuit are connected to the bases of the npn transistors Q5 and Q6 which serve as the noninverting and inverting input terminals of the second differential stage 8. The terminals of the resistors R3 and R4 which are not connected to the transistors Q7 and Q8 are connected to the power supply terminal 1.

The first emitter follower stage 9 has a pnp transistor Q9 connected to the collector of the npn transistor Q4 of the first differential stage 7, and a current source I3 electrically connected to the power supply terminal 1 connected to the emitter of the pnp transistor Q9. The collector of the transistor Q9 is electrically connected to the GND terminal 2.

The second emitter follower stage 10 has an npn transistor Q10 connected to the collector of the npn transistor Q6 of the second differential stage 8, and a current source I4 electrically connected to the GND terminal 2 connected to the emitter of the npn transistor Q10. The collector of the transistor Q10 is electrically connected to the power supply terminal 1.

The current source I3 of the first emitter follower stage 9 is connected in parallel with the npn transistor Q10 of the second emitter follower stage 10. The current source I4 of the second emitter follower stage 10 is connected in parallel with the pnp transistor Q9 of the first emitter follower stage 9. The current source I3, the emitter of the pnp transistor Q9, the emitter of the npn transistor Q10, and the current source I4, all of which are commonly connected, are connected to the input terminals of the phase compensation capacitor C1 and the buffer amplifier 3. The output terminal of the buffer amplifier 3 is connected to the output terminal 4 of the amplification circuit.

In the amplification circuit having the above arrangement, the first differential stage 7 serves as a differential circuit for intentionally unbalancing the circuit element parameters by changing the sizes of the input transistors Q1 and Q2 and the active load transistors Q3 and Q4, and the resistances of the resistors R1 and R2, thereby generating an offset voltage. The polarity of the noninverting input side is set lower than that of the inverting input side.

Similarly, the second differential stage 8 serves as a differential circuit for intentionally unbalancing the circuit element parameters to generate an offset voltage in accordance with the same technique as in the first differential stage 7. The polarity of the noninverting input terminal of the second differential stage 8 is set higher than that of the inverting input terminal, unlike in the first differential stage 7.

The relationship between the stability and the output waveform in a step response in the feedback circuit will be described below. As a condition for inhibiting oscillation in the negative feedback circuit, the phase rotation amount is set less than 180° when the gain of the feedback loop is 1, as described above. This is true only if all the circuits in the feedback loop fall within the linear small-signal operation range. For example, in a transient state having a large amplitude as in the step response, some of the circuits in the feedback loop lose linearity or are set in a biased state wherein the capability of the elements as the amplification elements lowers. Even if the above stability condition is assured, no oscillation occurs. That is, the stability condition must be assured only when the output voltage is an output converging voltage ± several ten mV in the step response. In this case, all the circuits in the feedback loop are set in the linear operation range.

While the output voltage approaches the output voltage convergence value ± several ten mV in the step response, the step response is kept stable even if the impedance at a circuit node is decreased to allow high-speed operation and set an easy oscillation state. At this time, high-speed step response can be achieved.

A circuit operation in a step response having a large amplitude by connecting the output terminal 4 to the inverting input terminal 6 to change the amplification circuit having the above circuit arrangement to a voltage follower amplification circuit will be described below. The rising operation of the circuit will be exemplified with reference to FIG. 4.

Figure 4:
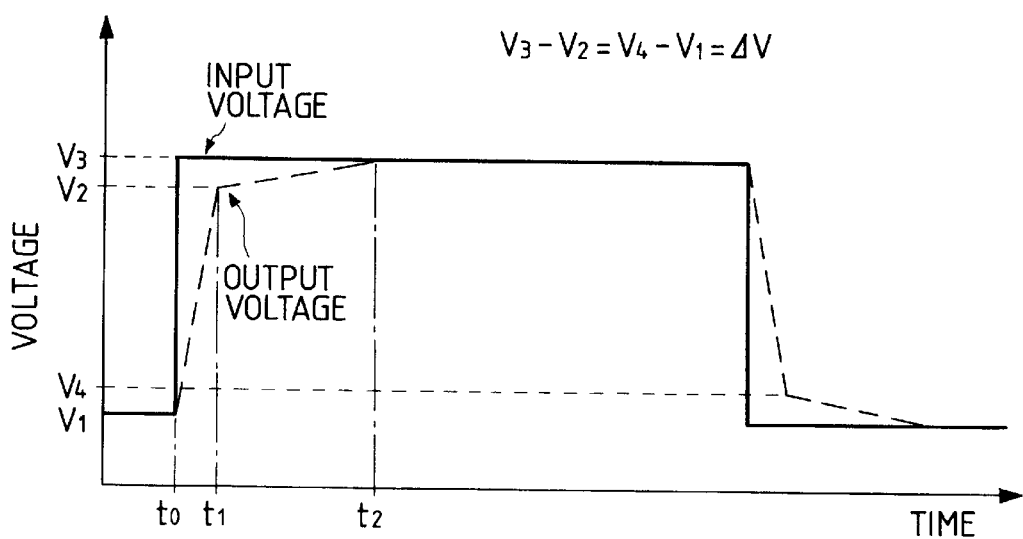
FIG. 4 is a timing chart for explaining a step response associated with the operation of the amplification circuit of the embodiment.

When a rising pulse having an input voltage shown in FIG. 4 is input to the noninverting input terminal 5, the voltage at the inverting input terminal 6 connected to the output terminal 4 is $v_1$, and the voltage at the noninverting input terminal 5 is $v_3$. For this reason, almost all the current from the current source I1 in the first differential stage 7 passes through the pnp transistor Q2 and is output to the first emitter follower stage 9. The pnp transistor Q9 in the emitter follower stage 9 abruptly changes to an almost cutoff state. The first emitter follower stage 9 tends to charge the phase compensation capacitor C1 with the current from the current source I3.

On the other hand, since the base potential of the npn transistor Q5 in the second differential stage 8 is higher than the base potential of the npn transistor Q6, almost all the current from the current source I2 passes from the npn transistor Q5 to the base of the npn transistor Q10 of the second emitter follower stage 10 through the pnp transistors Q7 and Q8. The npn transistor Q10 abruptly changes to the ON state, thereby abruptly charging the phase compensation capacitor C1 with the emitter current of the npn transistor Q10. The npn transistor Q10 has an emitter follower arrangement and its output impedance is very low. For this reason, the charge rate of the phase compensation capacitor C1 is very high. During the period ($t_0$ to $t_1$) (FIG. 4) in which the npn transistor Q10 is kept on, the output voltage increases at high speed from $v_1$ to $v_2$.

As described above, the second differential stage 8 is applied with the offset voltage such that the noninverting input terminal is kept balanced at a voltage higher than that at the inverting input terminal. Assume that the offset voltage is given as $\Delta v$. In this case, when the input voltage (=voltage at the noninverting input terminal) is given as $v_3$, and the output voltage (=voltage at the inverting input terminal) reaches $v_3 - \Delta v \equiv v_2$, the second differential stage 8 is set in the balanced state. The output current to the base of the npn transistor Q10 abruptly decreases. A current is supplied by $I4/h_{FEQ10}$ ($h_{FEQ10}$ is $h_{FE}$ of the npn transistor Q10).

As described above, at this time, the first differential stage 7 is applied with the offset voltage such that the noninverting input terminal is balanced at a voltage lower than that at the inverting input terminal. For this reason, when the output voltage is $v_2$, the balanced state cannot be obtained yet. The pnp transistor Q9 of the first emitter stage 9 is almost set in the OFF state, the current source I3 tends to further charge the capacitor C1, and the output voltage starts to increase. Note that the charge current at this time is much smaller than the emitter current of the npn transistor Q10 in the ON state, so that the rate of increase in output voltage is low. In this manner, when the output increases from $v_2$, the second differential stage 8 operates to almost set the npn transistor Q10 in the cutoff state. When the emitter current of the npn transistor Q10 becomes a level almost negligible with respect to the currents from the current sources I3 and I4, the increase in output can be stopped when the currents from the current sources I3 and I4 are set equal to each other.

When the offset voltage $\Delta v$ is several ten mV or more, and a differential value equal to or smaller than the offset voltage value is input to the differential stages 7 and 8, all the circuits are set in the linear operation range. In this case, the pnp transistor Q9 and the npn transistor Q10 are almost set in the cutoff state, and the phase compensation capacitor C1 can be set in consideration of the output impedances of the current sources I3 and I4. The frequency of the pole formed with the phase compensation capacitor C1 lowers to stabilize the feedback system because the output impedances of the current sources are very high.

When a falling pulse is input to the noninverting input terminal 5, a high-speed circuit operation with high stability can be obtained as in the case wherein the rising pulse is input. In this case, the voltage $v_4 - v_1$ in FIG. 4 becomes the offset voltage $\Delta v$ applied to the first differential stage 7.

Figure 5:
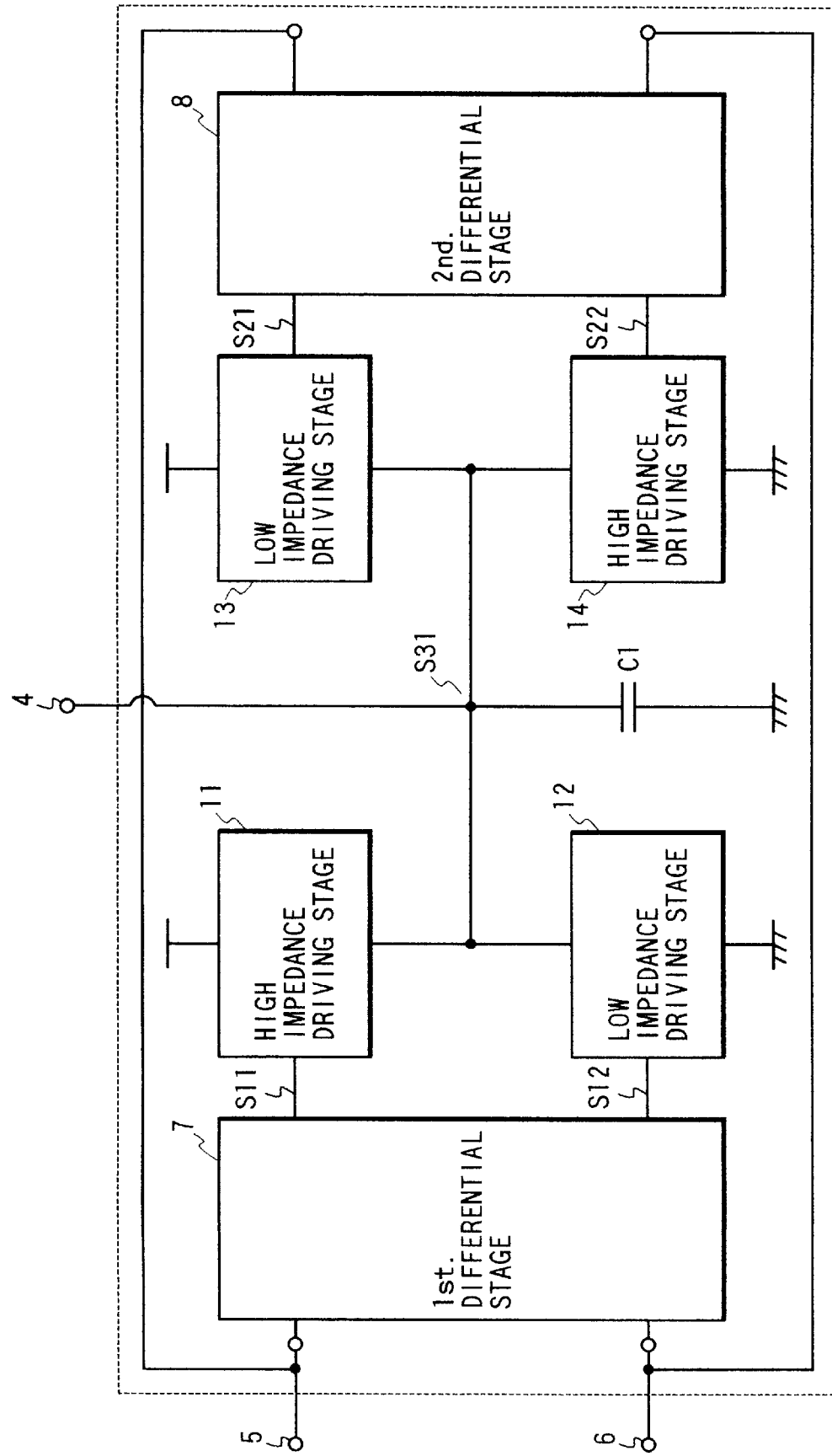
FIG. 5 is a schematic block diagram of a basic circuit of the amplification circuit of the present invention.

FIG. 5 is a schematic block diagram of a basic circuit according to the present invention. This basic circuit has noninverting and inverting input terminals 5 and 6, a first differential stage 7, a high impedance driving stage 11 for receiving one output S11 from the first differential stage 7 and driving an output S31 at a high impedance, a low impedance driving stage 12 for receiving the other output S12 from the first differential stage 7 and driving the output S31 at a low impedance, an output terminal 4, a phase compensation or load capacitor C1 connected to the output terminal 4, a driving stage 13 for receiving one output S21 from a second differential stage 8 and driving the output S31 at a low impedance, and a driving stage 14 for receiving the other output S22 from the second differential stage 8 and driving the output S31 at a high impedance. The noninverting input terminals of the first and second differential stages 7 and 8 are short-circuited, and the inverting input terminals thereof are also short-circuited. The offset voltage to the first differential stage 7 is set such that the polarity of the inverting input is higher than that of the noninverting input, while the offset voltage to the second differential stage 8 is set such that the polarity of the inverting input is lower than that of the noninverting input.

Note that the high impedance driving stage 11, the low impedance driving stage 12, the low impedance driving stage 13, and the high impedance driving stage 14 correspond to the current source I3, the npn transistor Q9, the npn transistor Q10, the current source I4 in FIG. 3, respectively.

Figure 6:
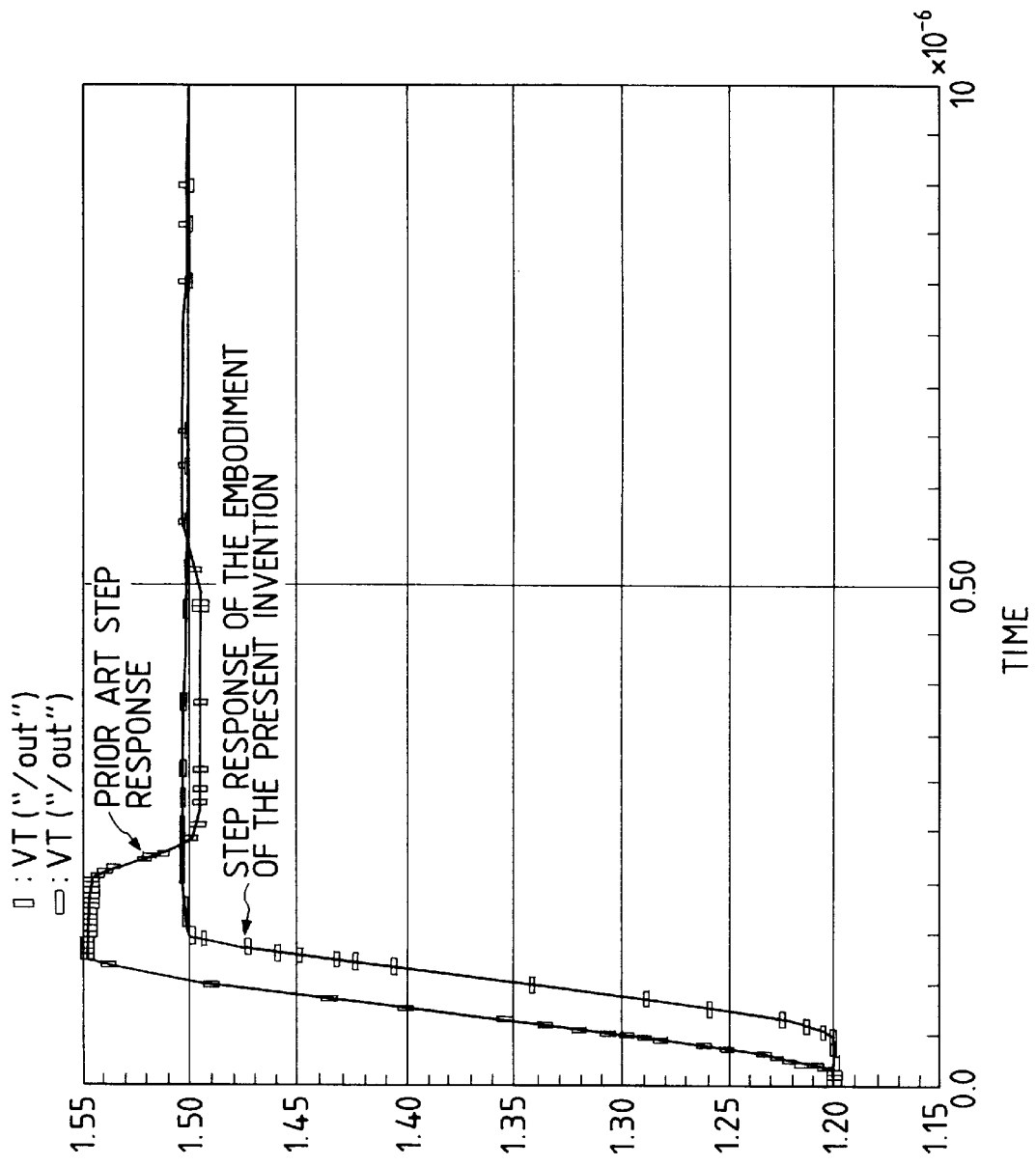
FIG. 6 is a timing chart showing the step response SPICE simulations of the circuit of the present invention and a comparative example.

FIG. 6 shows the step response SPICE simulation result of this embodiment and the step response SPICE simulation result of a comparative example obtained when the constant current sources I3 and I4 are omitted from the circuit of this embodiment and the offsets to the two input differential stages are set zero. As can be apparent from the result in FIG. 6, the rising slewing rates of the two waveforms are almost equal to each other, but stability in the comparative example is poorer than that of this embodiment. Almost no overshooting or undershooting appears in this embodiment. The present invention apparently assures both high-speed operation and high stability.

Figure 7:
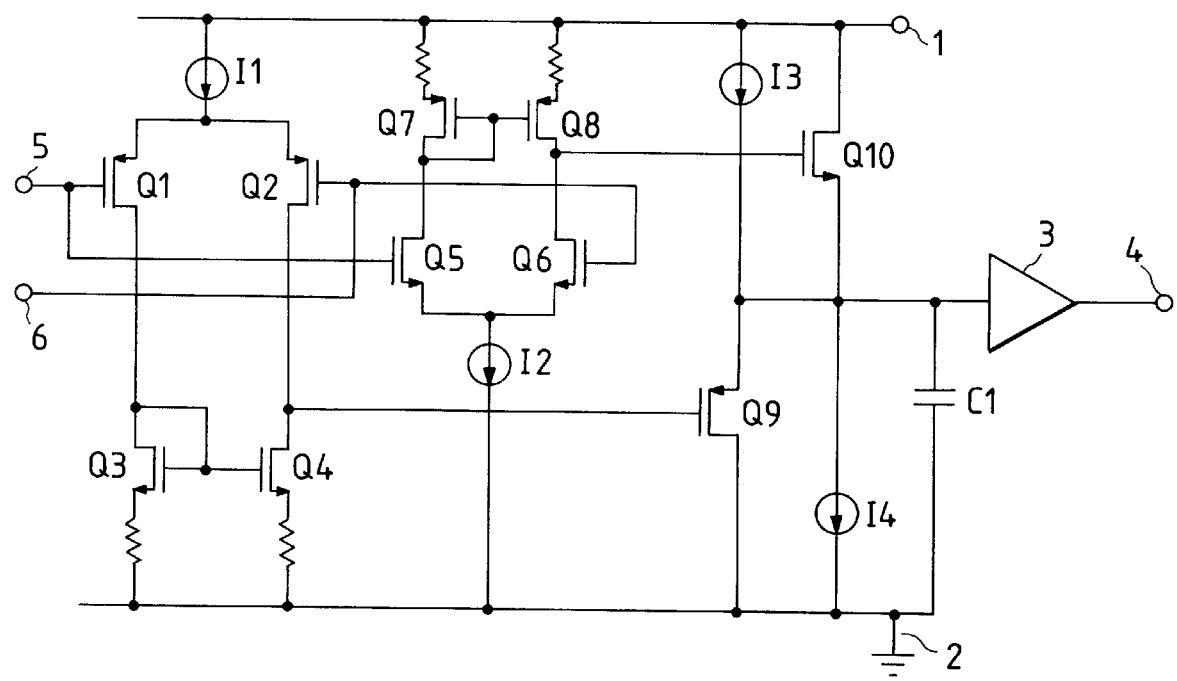
FIG. 7 is a schematic circuit diagram showing an amplification circuit according to another embodiment of the present invention.

In the above embodiment, the first driving means and the second constant current means, and the second driving means and the first constant current means are constituted by the emitter follower circuits, but may be constituted by source follower circuits. FIG. 7 is a circuit diagram of an amplification circuit constituted by field effect transistors. In the circuit arrangement shown in FIG. 7, the first driving means and the second constant current means, and the second driving means and the first constant current means are constituted by source follower circuits, and at the same time, the first and second differential stages are constituted by field effect transistors in place of bipolar transistors. In this case, the stable operation can be performed as in the above embodiment.

As has been described above, according to the present invention, a plurality of input differential stages having offset voltages having different values which can be arbitrarily set, and the next stages for receiving the outputs from these differential stages are constituted by the combinations of low and high impedance driving circuits. In the step response, an amplification circuit can output a waveform at a high speed until a given voltage before an output voltage from an amplifier reaches an input voltage and a stable waveform at a low speed without ringing until the output voltage reaches the input voltage, and can obtain a high-speed, high-accuracy, low-noise output waveform.

There can be provided an amplification circuit excellent in response and transient characteristics almost free from over-

What is claimed is:

1. An amplification circuit having a noninverting input terminal, an inverting input terminal, and an output terminal, comprising:

a first differential stage having noninverting and inverting input terminals respectively connected to said noninverting and inverting input terminals of said amplification circuit;

a first driving stage for driving to flow a current from said output terminal to a low potential power supply at a low impedance on the basis of an output from said first differential stage;

a first constant current stage connected in parallel with said first driving stage to flow a current from said output terminal to said low potential power supply at a high impedance;

a second differential stage having noninverting and inverting input terminals respectively connected to said noninverting and inverting input terminals of said amplification circuit;

a second driving stage for driving to flow a current from a high potential power supply to said output terminal at a low impedance on the basis of an output from said second differential stage; and a second constant current stage connected in parallel with said second driving stage to flow a current from said high potential power supply to said output terminal at a high impedance, wherein said noninverting input terminal of said first differential stage has a lower offset voltage than that of said inverting input terminal thereof, and said noninverting input terminal of the second differential stage has a higher offset voltage than that of said inverting input terminal thereof.

2. A circuit according to claim 1, wherein said first driving stage and said second constant current stage and/or said second driving stage and said first constant current stage comprise emitter follower circuits.

3. A circuit according to claim 1, wherein said first driving stage and said second constant current stage and/or said second driving stage and said first constant current stage comprise source follower circuits.

4. An amplification circuit comprising at least two differential stages as initial stages having different offsets, driving stages connected to the outputs of said differential stages, and a phase compensation capacitor, wherein said driving stage connected to one of said differential stages comprises a circuit for driving to charge said phase compensation capacitor at a low impedance, and a circuit for discharging said phase compensation capacitor at a high impedance, said driving stage connected to the other of said differential stages comprises a circuit for driving to charge said phase compensation capacitor at a high impedance and a circuit for discharging said phase compensation capacitor at a low impedance, and output sections of said driving stages are commonly connected to said phase compensation capacitor.

5. A circuit according to claim 4, wherein said circuit for driving said phase compensation capacitor at the high impedance has a current source.

6. A circuit according to claim 4, wherein said circuit for driving said phase compensation capacitor at the low impedance has a voltage source.

7. A circuit according to claim 4, wherein said circuit for driving to charge said phase compensation capacitor at the low impedance is a circuit for charging said phase compensation capacitor with a voltage.

8. A circuit according to claim 4, wherein said circuit for driving to discharge said phase compensation capacitor at the high impedance is a circuit for discharging said phase compensation capacitor with a current.

9. A circuit according to claim 4, wherein said circuit for driving to discharge said phase compensation capacitor at the low impedance is a circuit for discharging said phase compensation capacitor with a voltage.

10. A circuit according to claim 4, wherein said circuit for driving to charge said phase compensation capacitor at the high impedance is a circuit for charging said phase compensation capacitor with a current.

* * * * *